US006832339B1

(12) United States Patent
Reed et al.

(10) Patent No.: US 6,832,339 B1
(45) Date of Patent: Dec. 14, 2004

(54) METHODS AND APPARATUS FOR PROGRAMMING A SOLID-STATE METER

(75) Inventors: Eric B. Reed, East Berlin, CT (US); Maniunath Garalapuraiaha, Farmington, CT (US); Karl Pedersen, Ansonia, CT (US); Leslie Rosenau, Dover, NH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/569,459

(22) Filed: May 12, 2000

(51) Int. Cl.[7] .............................................. G06F 11/00
(52) U.S. Cl. ........................................ 714/38; 324/74
(58) Field of Search .............................. 714/38, 39, 40; 702/58, 61, 65; 711/104, 114; 324/74, 142, 116, 157

(56) References Cited

U.S. PATENT DOCUMENTS

| 4,077,061 | A | | 2/1978 | Johnston et al. |
| 4,283,772 | A | * | 8/1981 | Johnston ..................... 713/600 |
| 4,298,839 | A | | 11/1981 | Johnston |
| 4,465,970 | A | | 8/1984 | DiMassimo et al. |
| 4,837,504 | A | * | 6/1989 | Baer et al. .................. 324/142 |
| 4,999,572 | A | | 3/1991 | Bickford et al. |
| 5,109,507 | A | * | 4/1992 | Check, Jr. ....................... 714/6 |
| 5,170,360 | A | | 12/1992 | Porter et al. |
| 5,467,286 | A | | 11/1995 | Pyle et al. |
| 5,495,167 | A | * | 2/1996 | Cotroneo ..................... 324/74 |
| 5,525,898 | A | | 6/1996 | Lee, Jr. et al. |
| 5,530,831 | A | | 6/1996 | Akiyama et al. |
| 5,548,527 | A | * | 8/1996 | Hemminger et al. .......... 702/62 |
| 5,631,554 | A | * | 5/1997 | Briese et al. ............. 324/76.77 |
| 5,742,512 | A | * | 4/1998 | Edge et al. .................... 702/57 |
| 5,805,833 | A | | 9/1998 | Verdun |
| 5,831,428 | A | * | 11/1998 | Pyle et al. ................... 324/142 |
| 6,000,034 | A | | 12/1999 | Lightbody et al. |
| 6,094,622 | A | | 7/2000 | Hubbard et al. |

FOREIGN PATENT DOCUMENTS

| EP | 0 872 715 A2 | 10/1998 |
| EP | 0 857 978 A2 | 12/1998 |

OTHER PUBLICATIONS

International Search Report, dated Jul. 18, 2002, Application No. PCT/US 01/15302, 9 pages.
Nicholas P. Triano, Geek.Com PDA Review: Psion Netbook, available from Internet:, Mar. 28, 2000, pp. 1–9, XP002187154 URL:http://www/geek.com/hwswrev/pda/netbook/htm.

* cited by examiner

*Primary Examiner*—Dieu-Minh Le
(74) *Attorney, Agent, or Firm*—Armstrong Teasdale LLP

(57) ABSTRACT

A method is described for reprogramming a meter, including configuring the meter to accept user code reprogramming at meter power-up and, at power-up, providing user code reprogramming to the meter control program. The meter is configured to accept user code at power-up by executing processor boot loader code providing for optional loading of user code into the processor memory upon processor boot-up. The meter user thus can change metering functions and options without disassembling the meter or removing it from service.

19 Claims, 3 Drawing Sheets

| | MASTER TRANSMITS | SLAVE RECEIVES |
|---|---|---|
| 90 | DRIVE BUS CONTROL LINE HIGH | |
| 92 | CONFIGURE DATA PORT AS OUTPUT PORT | |
| 94 | WRITE DATA ON TO DATA BUS | |
| 96 | STROBE | CHECK BUS CONTROL LINE. IF LOW, INVALID RECEIVE. |
| 98 | START ACK TIMER WAIT FOR ACK STROBE FROM SLAVE | READ DATA BYTE FROM THE DATA BUS STROBE |
| 100 | IF ACK STROBE IS RECEIVED, TRANSMISSION COMPLETE, DRIVE BUS CONTROL LINE LOW ELSE ABORT TRANSMISSION | RECEPTION COMPLETE |

FIG. 4

| | SLAVE TRANSMITS | MASTER RECEIVES |
|---|---|---|
| 110 | CHECK BUS CONTROL LINE, IF STILL HIGH SET BUS CONTENTION ERROR | |
| 112 | CONFIGURE DATA PORT AS OUTPUT PORT | |
| 114 | WRITE DATA ON TO DATA BUS | |
| 116 | STROBE | READ DATA BYTE FROM THE DATA BUS |
| 118 | START ACK TIMER WAIT FOR ACK STROBE FROM SLAVE | STROBE |
| 120 | IF ACK STROBE IS RECEIVED, TRANSMISSION COMPLETE, ELSE ABORT TRANSMISSION | RECEPTION COMPLETE |

METHODS AND APPARATUS FOR PROGRAMMING A SOLID-STATE METER

BACKGROUND OF THE INVENTION

This invention relates generally to energy metering, and more particularly, to solid-state electricity metering.

Electricity meters are utilized to measure energy usage. Such meters must be reliable, cost-effective and accurate. In addition, it is desirable for a meter to be configurable so that functionality can be added to or removed from the meter, as needed.

Metering energy consumption by loads coupled to a single phase of a power line, such as residences, typically is performed by a mechanical meter including a disk which rotates at a rate related to energy consumption. A mechanical register is driven by the disk. Specifically, the mechanical register includes gears and a display. The gears are coupled to and driven by the disk, and the gears drive the display. Kilowatt-hour consumption is indicated on the display.

Such mechanical meters are extremely reliable and cost effective. Mechanical meters, however, typically display limited data, e.g., only watt-hour consumption, and are not configurable, e.g., functionality is not easily added to such meters when installed in the field.

Meters that include electronic registers typically are utilized for metering energy consumption by commercial and small industrial loads and in some residential applications. The electronic registers measure energy consumption as well as other values useful in billing, such as demand and time-of-day usage. Such meters include a disk which rotates at a rate related to energy consumption, and an optical assembly that generates electric pulses at a rate proportional to the rate of rotation of the disk. The pulses are provided to the electronic register for making energy consumption calculations. Such a meter typically is referred to as an electromechanical meter since the metering function is performed using a mechanical disk and the register function is performed by an electronic register.

Electro-mechanical meters provide more processing capability and metering quantities than mechanical meters. Electro-mechanical meters also are more flexible in that functionality can be added to or removed from the meter. For example, electronic demand registers and a time-of-use registers are fabricated as separate, interchangeable modules that can be secured within the meter enclosure depending upon the desired functionality.

Meters that perform both the metering and register functions using electronics, i.e., no rotating disk, sometimes are referred to as solid state meters. Such meters are more expensive to fabricate than mechanical meters, and therefore, typically are only utilized in high energy usage applications, e.g., only for industrial sites.

It would be desirable to provide a solid state residential meter that is not only reliable and accurate, but also cost competitive with single phase mechanical meters. It also would be desirable to provide such a residential meter that is flexible in that the meter functionality can be upgraded and downgraded in the field without a need to remove the meter from the installation. In order to install additional or different functions, however, it may be necessary to reprogram a processor in the meter. Reprogramming may require disassembling the meter and removing the processor to be reprogrammed and may even require the meter to be removed from the installation.

BRIEF SUMMARY OF THE INVENTION

A method is described below for reprogramming a meter without a need to disassemble it or remove it from the installation. In one embodiment, the method includes configuring the meter to accept user code reprogramming at meter power-up and, at power-up, providing user code reprogramming to the meter control program. The meter is configured to accept user code at power-up by executing processor boot loader code providing for optional loading of user code into the processor memory upon processor boot-up.

The above-described method allows a user to reprogram the meter processor easily and quickly. The meter user thus can add or change metering functions and options without disassembling the meter or removing it from service.

BRIEF DESCRIPTION OF THE DRAWINGS

FIG. 4 is a table summarizing transmission by an option board as master over the interface shown in FIGS. 1 and 2; and FIG. 5 is a table summarizing transmission by a meter board as slave over the interface shown in FIGS. 1 and 2.

DETAILED DESCRIPTION OF THE INVENTION

Although the present invention is described herein in the context of an electricity meter, it should be understood that the invention is not limited to practice in connection with such meters. The present invention can be used in connection with measurement apparatus generally, and is not limited to practice in only electricity metering.

Figure 1:
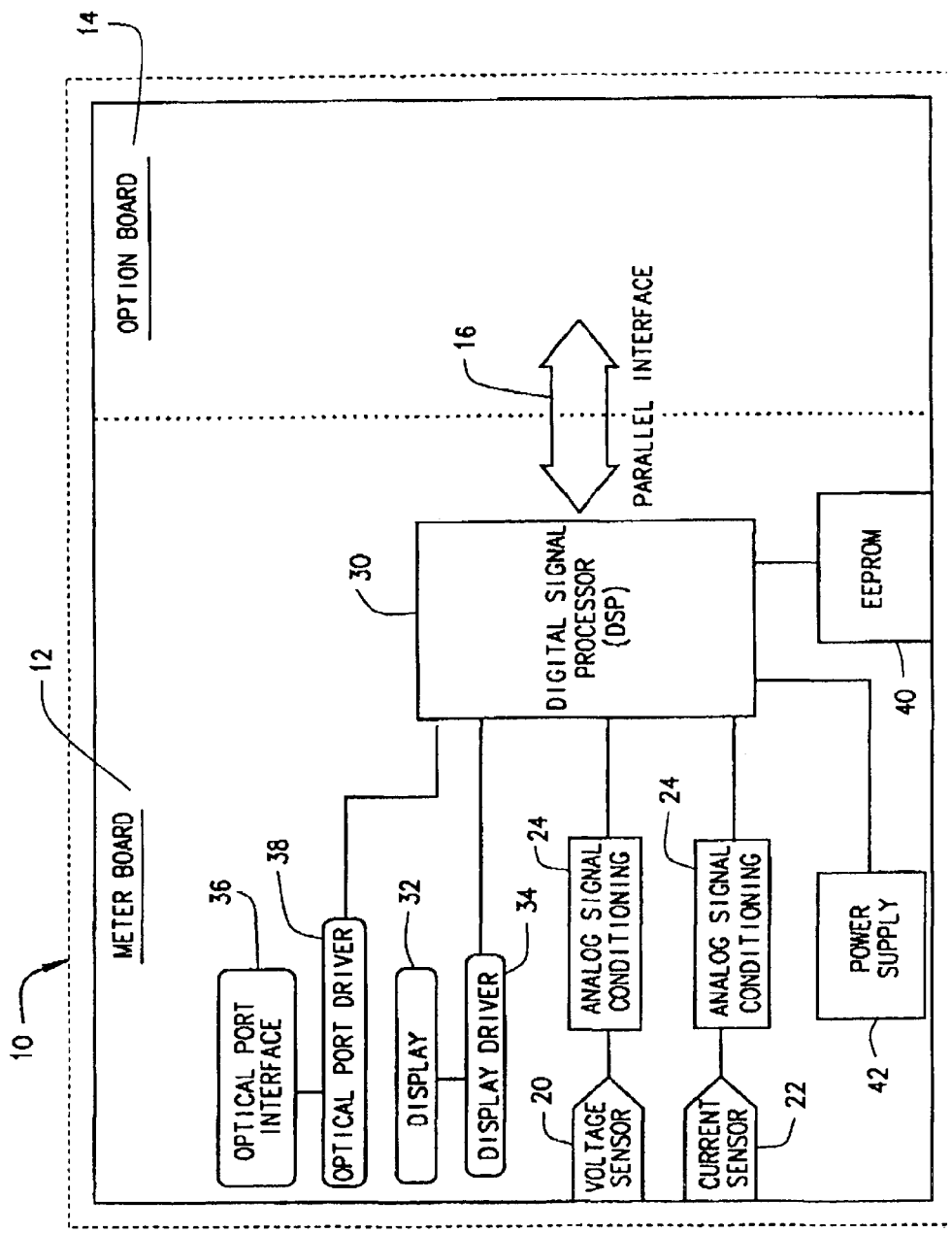
FIG. 1 is a block diagram of a solid-state single-phase meter.

FIG. 1 is a block diagram illustration of a solid state meter 10. Meter 10 includes a meter board 12 and an option board 14 coupled by a parallel interface 16. Meter board 12 includes a voltage sensor 20 and a current sensor 22. Sensors 20 and 22, in operation, typically receive input analog voltage and current signals from the multi-phase power line (not shown). Signals from sensors 20 and 22 are conditioned, e.g. filtered, using analog filters 24 and converted into digital signals by a digital signal processor (DSP) 30.

In another embodiment, sensors 20 and 22 are coupled to separate analog-to-digital (A/D) converter(s) that convert the input analog voltage and current signals to digital signals, and the digital signals are sampled by DSP 30. During A/D conversion, noise can be introduced into meter board 12, for example, by analog filter 24 impedance, that results in a nonlinear signal conversion. As is known in the art, passive filters (consisting of a combination of resistors and capacitors or inductors) may be used to reduce input noise. Even higher accuracy and conversion linearity may be obtained by using active filters, consisting of operational amplifiers having fast slew rates to reduce noise.

DSP 30 performs metering quantity calculations and functions using the digital voltage and current values. For example, DSP 30 executes a range-switching algorithm that compensates for hysteresis and thereby reduces calibration point error. Accuracy of converted signals also is increased by utilizing digital filtering and sampling techniques. For example, in one embodiment DSP 30 uses digital filters and dither to smooth input signals. DSP 30 may, for example, be a processor commercially available as Model Number TMS320C241 from Texas Instruments Company, P.O. Box 6102, Mail Station 3244, Temple, Tex. 76503, modified to perform metering functions.

DSP 30 is coupled to a display 32, e.g. a liquid crystal display (LCD), driven by a display driver 34 to control display of various selected metering quantities. DSP 30 also is coupled to an optical communications port 36 driven by an optical port driver 38 to enable, for example, an external reader to communicate with DSP 30. Port 36 may be, for example, an OPTOCOM™ port of General Electric Company, 130 Main Street, Somersworth, N.H. 03878, which is well known and in accordance with ANSI type II optical port specifications.

DSP 30 includes a programmable flash read-only memory (ROM). A control program for controlling execution of metering and other functions is stored in flash ROM. A portion of the flash ROM is preprogrammed with boot loader code providing for optional loading of user code from, for example, optical port 36 into DSP 30 flash ROM upon boot-up of DSP 30. DSP 30 also includes a test access port in accordance with IEEE Standard 1149.1 (JTAG emulator port) configured to accept, for example, input from an emulator (not shown) for testing purposes. DSP 30 may also generate additional outputs used for various other functions as is well known in the art.

Meter board 12 and option board 14 are configured to communicate with each other via parallel interface 16 under control of DSP 30. In one embodiment DSP 30 is programmed to provide for operation of additional option boards that are interchangeable with option board 14 via interface 16 hardware connection. DSP 30 also is coupled to an electronically erasable programmable read-only memory (EEPROM) 40 for storage of metering data. Meter board 12 includes a power supply 42 that supplies power to meter board 12 and to option board 14. Meter 10 also includes a bezel (not shown) having, for example, buttons labeled TEST and RESET. If not utilized by meter board 12, bezel buttons are available for use by option board 14 over parallel interface 16 for functions using input from a meter 10 user.

It should be understood that the present invention can be practiced with many alternative processors, and is not limited to practice in connection with just DSP 30. Therefore, and as used herein, the term DSP is not limited to mean just those integrated circuits referred to in the art as digital signal processors, but broadly refers to microcomputers, processors, micro-controllers, application-specific integrated circuits, and other programmable circuits.

Figures 2, 3:
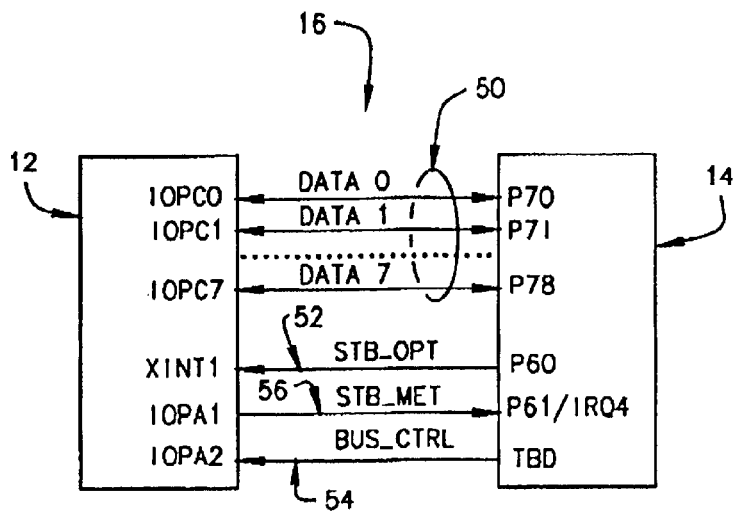
FIG. 2 is a diagram of the parallel interface between the meter board and option board shown in FIG. 1.
FIG. 3 is a table of option board connector pin definitions for the parallel interface shown in FIGS. 1 and 2.

FIG. 2 is a diagram of parallel interface 16 between meter board 12 and option board 14. DSP 30 is used to configure meter board 12 and option board 14 to communicate with each other over an eight-bit bi-directional parallel bus 50. A data strobe line STB_OPT 52 and a bus control line BUS_CTRL 54 are unidirectional from option board 14 to meter board 12. A data strobe line STB_MET 56 is unidirectional from meter board 12 to option board 14.

Interface 16 includes a 24-pin header/receptacle pair (not shown), with header (e.g. a GE Header Straight Connector Part Number 9938482001) on meter board 12 and receptacle on option board 14. FIG. 3 defines connector pins 60 for the parallel interface shown in FIGS. 1 and 2. Power pin +VD 62 provides 5V digital voltage and power pin V_OPT 64 provides 9.5V analog unregulated voltage. Power buses 62 and 64 share a 50-mA steady-state current. If meter 10 enters a power-fail condition, signal POWER_FAIL 66 is asserted low by DSP 30. POWER_FAIL 66 signals option board 14 that meter 10 is proceeding with an emergency shutdown due to power loss and that all meter 10 data is to be stored in EEPROM 40. Connectors S1 68 and S2 70 connect to meter 10 bezel buttons TEST and RESET (not shown) respectively, which are not used by meter board 12. Connectors S1 68 and S2 70 make buttons TEST and RESET available to receive input from a meter 10 user for option board 14 functions. Transmitter connector OPTICOM_TX 72 and receiver connector SCIRX 74 are used to make optical port 36 available for use by option board 14. Connector PULSE_DIS 76 is asserted to disable SCIRX 74 from DSP 30 so that optical port communications are not interrupted when DSP 30 issues test pulses during calibration or testing. Connector TENTHWATTHOUR 78 transmits a pulse signal from meter board 12 to option board 14 every time one-tenth Watt-hour is accumulated. A source of energy accumulation information thus is available for use by option board 14. In one embodiment, meter board 12 transmits fractional Watt-hour pulse information through connector 78 to at least one option board, e.g. a recorder device, that is non-parallel-interface-configured, i.e. is not configured to communicate over parallel interface 16 using parallel bus 50. Connector RESET 80 is tied to a voltage supervisor chip (not shown) on meter board 12. In the event that digital rail +VD 62 drops below or fails to rise through its set threshold, connector RESET 80 brings and holds meter board 12 and option board 14 into a reset condition. Connectors BATTERY(+) 82 and DGND/BATTERY(−) 84 provide access by option board 14 to power supply 42. Connector 86 is a spare connection reserved for future use.

At power-up of meter 10, meter board 12 detects the presence of an option board such as option board 14. Meter board 12 then reports an error condition if it does not receive an expected option board response. In one embodiment, option board 14 generates and controls sequencing of screens (not shown) for display on LCD 32 via parallel bus 50. Bus 50 has, for example, an average transfer rate of 280 kilobits per second. Such screens display, e.g., communication information, error codes and register quantities. Meter 10 is configured to perform data backup to EEPROM 40 at scheduled intervals, e.g. every three hours. In addition, if a power outage occurs, power supply 42 provides power to meter board 12 and to option board 14 while meter 10 data is being saved in EEPROM 40.

In operation, and if no option board is connected to meter board 12, meter board 12 processes voltage and current signals and performs metering functions in a stand-alone mode, i.e. without requiring option board input. DSP 30 then, for example, displays accumulated kilowatt-hours on LCD 32 and performs other metering quantity calculations and functions under control of meter board 12. Metering data is stored in EEPROM 40 and pulse signals are output via optical port 36.

When an option board is coupled to meter board 12, the option board and meter board 12 communicate in a half-duplex mode. Since only one board transmits at any point in time, communication is of a master-slave type. Option board 14 operates as master and meter board 12 operates as a slave, i.e. meter board 12 serves requests received from option board 14.

As shown in FIG. 4, when option board 14 transmits data, bus control line BUS_CTRL 54 first is driven high 90 to reserve bus access solely for transmission by option board 14. The board data port (not shown in FIG. 4) to parallel bus 50 then is configured 92 as an output port. Board 14 then latches data 94 and strobes 96 its strobe line STB_OPT 52. Upon detection of a strobe from strobe line STB_OPT 52, bus control line BUS_CTRL 54 is checked 96 for assertion as high, to confirm that data transfer by board 14 is valid. The board data port (not shown in FIG. 4) to parallel bus 50 then is configured 98 as an input port. Board 12 then reads 98 data from bus 50 and strobes 98 data strobe line STB_MET 56 as acknowledgment, for which board 14 has been waiting 98 since start 98 of an ACK timer (not shown) in DSP 30. Transmission is complete when board 14 has received 100 a strobe from strobe line STB_MET 56 as acknowledgment. Bus control line BUS_CTRL 54 then is driven low 100.

As shown in FIG. 5, when meter board 12 transmits data, bus control line BUS_CTRL 54 first is checked 110 for a low condition. A bus contention error is signaled 110 if BUS_CTRL 54 is high. The board data port to parallel bus 50 then is configured 112 as an output port and data is written 114 onto data bus 50. A strobe from strobe line STB_MET 56 is sent 116 to board 14, and board 12 then reads 116 the data from bus 50. ACK timer is started 118 and board 12 awaits 118 an acknowledgment strobe from strobe line STB_OPT 52. Transmission is complete 120 when strobe line STB_OPT 52 has signaled acknowledgment 118.

Occasionally it is desired to upgrade or change the control program residing in DSP 30 flash ROM, for example, to support newly available functions or to provide for a new type of option board not previously supported as interchangeable with option board 14. One method for reprogramming DSP 30 flash ROM includes removing meter 10 from service, removing DSP 30 from meter 10 and reprogramming flash ROM according to DSP 30 manufacturer instructions. Another method includes removing meter 10 from service, opening meter 10 and connecting an emulator to DSP 30 JTAG emulator port, and downloading a new control program to DSP 30 flash ROM using the emulator. Yet another reprogramming method includes removing meter 10 from service, opening meter 10 and using optical port 36 to download a new control program to DSP 30 flash ROM.

All of the above-described methods involve removing meter 10 from service and opening meter 10 to access flash ROM for reprogramming. In one embodiment a method for reprogramming flash ROM is practicable while meter 10 is in service. DSP 30 flash ROM boot loader code is incorporated for execution by meter 10 at meter 10 power-up. Thus when meter 10 is powered up and is signaled to accept reprogramming, meter 10 accepts a download of user code into DSP 30 flash ROM from an external source, e.g. from optical port 36.

The above-described method for reprogramming DSP 30 flash ROM does not require opening meter 10 or removing meter 10 from service. Upgrading meter 10 thus is made simpler and less time-consuming.

While the invention has been described in terms of various specific embodiments, those skilled in the art will recognize that the invention can be practiced with modification within the spirit and scope of the claims.

What is claimed is:

1. A method for reprogramming a control program controlling a metering apparatus including a power supply and a processor having a programmable memory, said method comprising the steps of:

configuring the metering apparatus to accept user code reprogramming using a boot loader code during power-up of the metering apparatus;

signaling the metering apparatus to accept a download of user code from an external source; and downloading the user code reprogramming to the metering apparatus control program at power-up from the external source to the metering apparatus.

2. A method in accordance with claim 1 wherein the processor includes boot loader code providing for optional loading of user code into the processor memory at processor boot-up, and said step of configuring the metering apparatus to accept user code reprogramming during power-up of the metering apparatus comprises incorporating the boot loader code for execution by the metering apparatus.

3. A method in accordance with claim 2 wherein the processor is a digital signal processor.

4. A method in accordance with claim 2 wherein the processor programmable memory includes a flash ROM and the boot loader code resides in the flash ROM.

5. A method in accordance with claim 2 wherein the metering apparatus includes an optical port, and said step of providing user code reprogramming to the metering apparatus control program at power-up comprises providing user code through the optical port.

6. A method in accordance with claim 2 wherein said step of providing user code reprogramming to the metering apparatus control program at power-up comprises reprogramming the control program while the metering apparatus is in service.

7. A metering apparatus comprising a power supply, a processor having a programmable memory and a metering apparatus control program, said metering apparatus configured to receive a signal instructing said metering apparatus to accept reprogramming of said control program using a boot loader code during power-up of said metering apparatus from a source external to said metering apparatus.

8. A metering apparatus in accordance with claim 7 further configured to accept reprogramming of said control program while said metering apparatus is in service.

9. A metering apparatus in accordance with claim 7 wherein said processor further comprises boot loader code providing for optional loading of user code into said processor memory upon boot-up of said processor, and said metering apparatus being configured to accept reprogramming of said control program during power-up of said metering apparatus comprises being configured to use said boot loader code.

10. A metering apparatus in accordance with claim 9 wherein said metering apparatus being configured to use said boot loader code comprises being configured to incorporate said boot loader code for execution by said metering apparatus.

11. A metering apparatus in accordance with claim 9 wherein said processor comprises a flash ROM and said boot loader code resides in said flash ROM.

12. A metering apparatus in accordance with claim 9 wherein said processor is a digital signal processor.

13. A metering apparatus in accordance with claim 9 configured to meter single-phase electricity.

14. A metering apparatus comprising a power supply, a processor having a programmable memory and a metering apparatus control program, said metering apparatus configured to receive a signal instructing said metering apparatus to accept reprogramming of said control program using a boot loader code during power-up of the metering apparatus, from a source external to said metering apparatus, while said metering apparatus is in service.

15. A metering apparatus in accordance with claim 14 further configured to accept reprogramming of said control program during power up of said metering apparatus.

16. A metering apparatus in accordance with claim 15 wherein said processor further comprises boot loader code providing for optional loading of user code into said processor memory at boot-up of said processor, and said metering apparatus being configured to accept reprogramming of said control program during power up of said metering apparatus comprises being configured to use said boot loader code.

17. A metering apparatus in accordance with claim 16 wherein said metering apparatus being configured to use said boot loader code comprises being configured to incorporate said boot loader code for execution by said metering apparatus.

18. A metering apparatus in accordance with claim 15 wherein said processor comprises a flash ROM and said boot loader code resides in said flash ROM.

19. A metering apparatus in accordance with claim 14 wherein said processor is a digital signal processor.

* * * * *